United States Patent
Shindo et al.

(10) Patent No.: US 6,284,013 B1
(45) Date of Patent: *Sep. 4, 2001

(54) METHOD FOR PREPARING HIGH-PURITY RUTHENIUM SPUTTERING TARGET AND HIGH-PURITY RUTHENIUM SPUTTERING TARGET

(75) Inventors: Yuichiro Shindo; Tsuneo Suzuki, both of Saitama-Ken (JP)

(73) Assignee: Japan Energy Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/508,256

(22) PCT Filed: Jul. 14, 1999

(86) PCT No.: PCT/JP99/03795

§ 371 Date: Mar. 8, 2000

§ 102(e) Date: Mar. 8, 2000

(87) PCT Pub. No.: WO00/04202

PCT Pub. Date: Jan. 27, 2000

(30) Foreign Application Priority Data

Jul. 14, 1998 (JP) .................................................. 10-198766

(51) Int. Cl.$^7$ ............................. C21B 11/10; B22F 11/00; C22F 1/14
(52) U.S. Cl. ............................. 75/10.28; 75/247; 75/369; 75/410; 75/631; 75/361; 75/367; 419/48
(58) Field of Search ............................. 75/247, 369, 410, 75/631, 10.28, 361, 367; 419/48

(56) References Cited

U.S. PATENT DOCUMENTS 6,036,741 * 3/2000 Shindo et al. ..................... 75/10.28

FOREIGN PATENT DOCUMENTS

| | | |
|---|---|---|
| 63-242934 | 10/1988 | (JP) . |
| 64-56831 | 3/1989 | (JP) . |
| 8-199350 * | 8/1996 | (JP) . |
| 9-41131 | 2/1997 | (JP) . |
| 11-50163 | 2/1999 | (JP) . |
| 11-61392 | 3/1999 | (JP) . |

* cited by examiner

*Primary Examiner*—Roy King
*Assistant Examiner*—Nicole Coy
(74) *Attorney, Agent, or Firm*—Howson and Howson

(57) ABSTRACT

There is provided a high-purity ruthenium sputtering target with a low impurity content, in particular producing extremely few particles, which is suitable for applications such as the formation of semiconductor thin films. The high-purity ruthenium sputtering target is manufactured by feeding crude ruthenium powder into a sodium hydroxide solution; blowing an ozone-containing gas while or after blowing chlorine gas into the solution to form ruthenium tetroxide; absorbing the ruthenium tetroxide in a hydrochloric acid solution or a mixed solution of hydrochloric acid and ammonium chloride, and evaporating the solution to dryness; sintering the resultant ruthenium salt in a hydrogen atmosphere to form high-purity ruthenium powder; and hot-pressing the ruthenium powder into a sputtering target.

6 Claims, No Drawings

METHOD FOR PREPARING HIGH-PURITY RUTHENIUM SPUTTERING TARGET AND HIGH-PURITY RUTHENIUM SPUTTERING TARGET

FIELD OF THE INVENTION

The present invention relates to a high-purity ruthenium sputtering target which can be used as a material for the lower or upper electrodes of ferroelectric semiconductor capacitors, and to a method for manufacturing such a high-purity ruthenium sputtering target.

BACKGROUND OF THE INVENTION

In the manufacture of semiconductors, the use of a thin film of a ferroelectric substance such as a BaSrTi composite oxide, a PbZrTi composite oxide, and a SrBiTa composite oxide on a wafer such as a silicon wafer constituting semiconductor elements as a capacitor has recently been studied. For using as the lower or upper electrode of such a thin ferroelectric capacitor film, the formation of a ruthenium oxide film by sputtering a target member consisting of ruthenium in an oxygen atmosphere has been studied.

In order to guarantee reliable semiconductor performance for semiconductor members formed by sputtering, it is critical that the content of metal impurities harmful to semiconductor devices is minimal. That is, impurities such as (1) alkali metal elements such as Na and K,
(2) radioactive elements such as U and Th, and
(3) heavy metal elements such as Fe and Ni, must be removed as much as possible.

Alkali metal elements such as Na and K move easily in insulating films, and radioactive elements such as U and Th emit alpha rays, causing soft errors. Heavy metals such as Fe and Ni may arise problems of interfacial junctions.

In general, the following method is used for the industrial manufacture of ruthenium. That is, crude ruthenium is mixed with potassium hydroxide and potassium nitrate, and undergone oxidation melting to convert ruthenium to soluble potassium ruthenate. This salt is extracted with water, and heated while blowing chlorine gas in to form ruthenium tetroxide, which is collected in diluted hydrochloric acid containing methanol. This solution is evaporated to dryness, the residue is sintered in an oxygen atmosphere to form ruthenium dioxide, which is further ignited in hydrogen to form metal ruthenium.

However, commercially available ruthenium powder manufactured by the above-described method contains large quantities of alkali metals such as Na and K, heavy metals such as Fe and Ni, and radioactive elements such as U and Th, and is not suitable as a material for the electrodes of ferroelectric capacitors.

For solving this problem, efforts have been done for highly purifying ruthenium.

For example, Japanese Patent Laid-Open No. 8-199350 discloses a method for manufacturing a high-purity ruthenium sputtering target having a purity of 5 N or higher, comprising the steps of alkali-melting commercially available ruthenium powder, leaching it with water, adding excess NaOH to it, being saturated with chlorine gas, and heating to convert ruthenium into ruthenium tetroxide; separating the ruthenium tetroxide by evaporation, absorbing the separated ruthenium tetroxide in a solution of hydrochloric acid and methanol, purifying it three times by distillation, refluxing and evaporating the solution to dryness to form gel-like precipitate of ruthenium hydroxide; drying this precipitate, heating the precipitate in the air to form ruthenium dioxide; heating this ruthenium dioxide in a hydrogen stream to form ruthenium powder of 5-N purity, hot-pressing this powder into a disc, and subjecting this disc to electron beam melting to remove Na, K, Mg, and Ca.

However, these conventional methods have problems in that a large number of process steps, complicated operations, and high manufacturing costs are required; the products are easily contaminated during the process steps; and the yield is poor. With increase in the density of wiring in semiconductor thin films, the formation of particles during sputtering arises a large problem. The formation of particles cannot be reduced by high-purity ruthenium target manufactured by conventional methods.

OBJECTS OF THE INVENTION

It is an object of the present invention to provide a method for manufacturing a high-purity ruthenium sputtering target having a low impurity content, and in particular, producing few particles, which is suitable for applications such as the formation of semiconductor thin films.

SUMMARY OF THE INVENTION

In order to solve the above-described problems, the present inventors repeated experiments, and found that most of crude ruthenium could be converted into ruthenium tetroxide by blowing chlorine gas into the NaOH solution of crude ruthenium, then blowing ozone into the solution, and the crystals of a ruthenium salt could be obtained by evaporating to dryness a solution of the ruthenium tetroxide in hydrochloric acid or in a mixed solvent of hydrochloric acid and an organic solvent, and that a high-purity ruthenium powder could be obtained by reducing these in a hydrogen atmosphere, and further treating them in an inert atmosphere. The inventors also found that the high-purity ruthenium sputtering target obtained by such a method has a low content of not only metal impurities which have arisen problems, but also gaseous components, thereby significantly decreasing the formation of particles.

On the basis of these findings, according to a first aspect of the present invention there is provided a method for manufacturing a high-purity ruthenium sputtering target comprising the steps of feeding crude ruthenium powder into a sodium hydroxide solution; blowing an ozone-containing gas during or after blowing chlorine gas into the solution to form ruthenium tetroxide; absorbing the ruthenium tetroxide in a hydrochloric acid solution or a mixed solution of hydrochloric acid and ammonium chloride, and evaporating the solution to dryness; sintering the resultant ruthenium salt in a hydrogen atmosphere to form high-purity ruthenium powder; and hot-pressing the ruthenium powder into a sputtering target.

According to a second aspect of the present invention there is provided a method for manufacturing a high-purity ruthenium sputtering target comprising the steps of feeding crude ruthenium powder into a sodium hydroxide solution; blowing an ozone-containing gas during or after blowing chlorine gas into the solution to form ruthenium tetroxide; absorbing the ruthenium tetroxide in a hydrochloric acid solution or a mixed solution of hydrochloric acid and ammonium chloride, and evaporating the solution to dryness; sintering the resultant ruthenium salt in a hydrogen atmosphere to form high-purity ruthenium powder; and subjecting the ruthenium powder to electron-beam melting to produce a sputtering target.

According to a third aspect of the present invention, there is provided a high-purity ruthenium sputtering target, wherein the content of each element of carbon, oxygen, and chlorine is 100 ppm or below.

According to a fourth aspect of the present invention, there is provided the high-purity ruthenium sputtering target according to the third aspect, wherein the purity of ruthenium after removing gaseous component is 99.995% or higher.

DETAILED DESCRIPTION OF THE PREFERRED EMBODIMENT

The preferred embodiment of the present invention will be described in detail below.

Crude ruthenium powder used in the present invention is not specifically limited, but it is generally crude ruthenium powder with a purity of about 98 to 99.9% commercially available. Such crude ruthenium normally contains 10 to 1000 ppm of Na, 10 to 1000 ppm of Fe, and 0.5 to 100 ppb of each of U and Th.

On the other hand, the purity of NaOH used for dissolving the crude ruthenium and the purity of chlorine gas blown in the solution are not limited, but those of generally used industrial grades can be used. This is because impurities contained in these can be separated efficiently from ruthenium tetroxide.

The concentration of NaOH is 10 to 400 g/l, preferably 100 to 350 g/l. If the concentration is less than 10 g/l, little ruthenium can be dissolved, and if the concentration exceeds 400 g/l, NaOH which has not been dissolved may remain, or a large quantity of the reaction product, NaCl, may deposit from the solution and interfere with reaction.

The reaction to form ruthenium tetroxide by dissolving ruthenium by blowing chlorine gas into the NaOH solution is as follows:

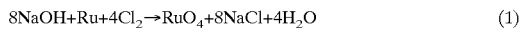

$$8NaOH + Ru + 4Cl_2 \rightarrow RuO_4 + 8NaCl + 4H_2O \quad (1)$$

The concentration of dissolved Ru should be 5 to 100 g/l. The concentration less than 5 g/l is not preferable, because a large quantity of the solution is required for dissolving ruthenium, and large equipment is required. The concentration exceeding 100 g/l is also not preferable, because ruthenium which has not been dissolved will remain, making the yield poor.

The quantity of chlorine gas to be blown in is preferably 0.5 to 1.5 times equivalent for NaOH. The quantity less than 0.5 times equivalent is not preferable, because the ruthenium cannot be dissolved completely, and ruthenium tetroxide is not formed sufficiently. The quantity of 1.5 times equivalent or more is also not preferable, because a large quantity of ruthenium dioxide is formed.

Although ruthenium is dissolved and reacts as described above, it is not completely converted into ruthenium tetroxide gas, but a part of ruthenium remains in the solution. Depending on the conditions, 80 to 90% of ruthenium is typically converted into ruthenium tetroxide and the rest remains in the solution. Therefore, by blowing ozone into the solution, ruthenium remaining in the solution is completely converted into ruthenium tetroxide. The time for blowing ozone into the solution may be after the completion of blowing chlorine gas.

The material of equipment for dissolving ruthenium is preferably glass or the like, and organic materials such as polyethylene is not preferable because organic materials may react with formed ruthenium tetroxide. Furthermore, by providing a trap between the reaction equipment and the absorption equipment, contamination with impurities from the mist from the dissolving equipment is prevented, and the contamination of the absorbing solution with impurities can be prevented.

The absorbing solution for ruthenium tetroxide is preferably a hydrochloride solution or a mixed solution of hydrochloric acid and ammonium chloride.

After the completion of the reaction, the solution is evaporated to dryness to form a ruthenium salt. This crystal is reduced at a low temperature in a hydrogen atmosphere to obtain high-purity ruthenium powder. Furthermore, by sintering the powder in an inert atmosphere, ruthenium powder containing little carbon, oxygen, and chlorine can be obtained.

The high-purity ruthenium powder thus obtained can be processed into a desired sputtering target by hot pressing or electron beam melting. For example, after the high-purity ruthenium powder obtained by the above-described method is filled in a mold made of graphite, the powder can be hot-pressed under the conditions of a temperature of 1200 to 2000° C. and a pressure of 100 to 300 kg/cm$^2$ to form a high-purity ruthenium sputtering target with a density of 95% or more. When electron beam melting is used, the high-purity ruthenium powder is melted under the conditions of a vacuum of 10$^{-4}$ torr and an electric current of 0.1 to 1 A, and processed by forging or the like to form a desired target. However, when electron beam melting was used, a target could not be formed by simply melting the material powder by electron beams, because the material was cracked during forging or rolling.

The high-purity ruthenium sputtering target according to the present invention features that the content of each of carbon, oxygen, and chlorine is 100 ppm or less, preferably 50 ppm or less. The content of each of carbon, oxygen, and chlorine exceeding 100 ppm is not preferable, because a large number of particles are formed. According the present invention, ruthenium having a purity of 99.995% or higher excluding gaseous components can be obtained. The lower purity is not preferable because leakage current increases.

The target of the present invention can minimize the formation of particles during sputtering, and produce little leakage current.

EMBODIMENTS

The present invention will be described below referring to examples, but the present invention is not limited by these embodiments.

EXAMPLE 1

In a flask, 580 g of commercially available ruthenium powder (purity: 99.9%) was fed, 320 g/l NaOH solution was added, and 500 liters of chlorine gas were blown in to dissolve the ruthenium powder, to form ruthenium tetroxide. This solution was heated to 80° C., and ozone was blown into the solution to convert ruthenium remaining in the solution to ruthenium tetroxide. As the absorbing solution, 6 liters of a solution of 25° C. having a hydrochloric acid concentration of 6 N, containing 10% methanol by volume, was prepared. In about 18 hours, all the ruthenium was converted to ruthenium tetroxide, and absorbed in the absorbing solution. The absorbing solution was evaporated to dryness to form 1360 g of crystalline ruthenium salts. The crystals were reduced in a hydrogen atmosphere at 300° C., then sintered in a nitrogen atmosphere at 1500° C., and 570 g of high-purity ruthenium powder was obtained. The yield was 95%. The resultant high-purity ruthenium powder was molded into a desired form, and hot-pressed under the conditions of a temperature of 1700° C. and a pressure of 200 kg/cm² for 2 hours to obtain a disc-shaped ruthenium sputtering target of a diameter of 110 mm, a thickness of 5 mm, and a density of 98%.

The impurity contents of the material ruthenium powder and the sputtering target are shown in Table 1.

TABLE 1

| Impurity | Na | K | Fe | U | Th | O | C | Cl |
|---|---|---|---|---|---|---|---|---|
| | | | | Unit: ppm (ppb for only U and Th) | | | | |
| Material | 60 | 20 | 46 | 2 | 5 | 800 | 250 | 100 |
| Target | 0.1 | 0.1 | 0.5 | <0.1 | <0.2 | 60 | 20 | <10 |

EXAMPLE 2

In a flask, 580 g of commercially available ruthenium powder (purity: 99.9%) was fed, 100 g/l NaOH solution was added, and 500 liters of chlorine gas was blown in to dissolve the ruthenium powder, to form ruthenium tetroxide. This solution was heated to 80° C., and ozone was blown into the solution to convert ruthenium remaining in the solution into ruthenium tetroxide. As the absorbing solution, 6 liters of a solution of 50° C. having a hydrochloric acid concentration of 9 N, containing 10% isopropanol by volume, was prepared. In about 18 hours, all the ruthenium was converted into ruthenium tetroxide, and absorbed in the absorbing solution. The absorbing solution was evaporated to dryness to form 1360 g of crystalline ruthenium salts. The crystals were reduced in a hydrogen atmosphere at 700° C., then sintered in a nitrogen atmosphere at 1200° C., and 570 g of high-purity ruthenium powder was obtained. The yield was 95%. The resultant high-purity ruthenium powder was molded into a desired form, and subjected to electron beam melting under the conditions of a vacuum of $1\times10^{-4}$ torr and an electric current of 0.5 A to obtain a disc-shaped ruthenium sputtering target of a diameter of 110 mm and a thickness of 5 mm.

The impurity contents of the material ruthenium powder and the sputtering target are shown in Table 2.

TABLE 2

| Impurity | Na | K | Fe | U | Th | O | C | Cl |
|---|---|---|---|---|---|---|---|---|
| | | | | Unit: ppm (ppb for only U and Th) | | | | |
| Material | 60 | 20 | 46 | 2 | 5 | 800 | 250 | 100 |
| Target | <0.1 | <0.1 | <0.1 | <0.1 | <0.2 | <10 | <10 | <10 |

Comparative Example

After 1000 g of crude ruthenium was subjected to alkali melting and water leaching, an excess of sodium hydroxide wad added. The solution was saturated by chlorine gas, heated, and evaporated to separate ruthenium tetroxide.

As the absorbing solution, 10 liters of a solution of 25° C. having a hydrochloric acid concentration of 6 N, containing 10% ethanol by volume, was prepared. The ruthenium tetroxide was absorbed in this solution, and purified by distillation three times. This solution was evaporated with a rotary evaporator for 24 hours to dryness. The resultant crystals were dried and heated in the air to obtain ruthenium dioxide. Furthermore, the ruthenium dioxide was heated in a hydrogen stream at 680° C. to obtain ruthenium powder. The yield was 50 to 60%. The average crystal grain diameter of the purified ruthenium powder was about 0.8 μm.

The resultant purified ruthenium powder was molded into a desired form, and hot-pressed under the conditions of a temperature of 1800° C. (Example 1) and a pressure of 300 kg/cm² for 2 hours to obtain a disc-shaped ruthenium sputtering target of a diameter of 110 mm, a thickness of 5 mm.

The impurity contents of the material ruthenium powder and the sputtering target are shown in Table 3.

TABLE 3

| Impurity | Na | K | Fe | U | Th | O | C | Cl |
|---|---|---|---|---|---|---|---|---|
| | | | | Unit: ppm (ppb for only U and Th) | | | | |
| Material | 60 | 20 | 46 | 2 | 5 | 800 | 250 | 100 |
| Target | 1.2 | 0.3 | 3 | 0.5 | 2 | 160 | 140 | <10 |

Each of ruthenium sputtering targets of Examples and Comparative Example were joined to a copper backing plate, and subjected to reactive sputtering in an oxygen atmosphere using magnetron sputtering equipment to form a ruthenium oxide thin film on an Si wafer. A thin film of a thickness of 400 nm was formed on a 4-inch silicon wafer, and particle densities on these thin films were measured. The electrode properties of the thin films were also measured. The results are shown in Table 4.

TABLE 4

| | Particle density (Particle/cm²) | Electrode property |
|---|---|---|
| Example 1 | 0.5 | Good |
| Example 2 | 0.1 | Good |
| Comparative Example | 10 | Large leakage current |

The high-purity ruthenium sputtering target featuring that the content of each element of carbon, oxygen, and chlorine was 100 ppm or less, which was obtained by the method according to the present invention, formed few particles during sputtering, and the electrode properties of the thin film were excellent.

According to the present invention, a high-purity ruthenium powder containing sufficiently reduced quantities of not only alkali metals, radioactive elements, and heavy metals, but also carbon, oxygen, and chlorine, can be manufactured, thereby enabling to manufacture a high-purity ruthenium sputtering target containing reduced quantities of these impurities. Also, the high-purity ruthenium sputtering target of the present invention forms few particles during sputtering, and has excellent electrode properties of the thin film, and can be used suitably as the thin film for the electrode of a ferroelectric capacitor for manufacturing a semiconductor device.

What is claimed is:

1. A method for manufacturing a high-purity ruthenium sputtering target comprising the steps of:

feeding crude ruthenium powder into a sodium hydroxide solution;

blowing an ozone-containing gas and blowing chlorine gas into said sodium hydroxide solution which was fed with crude ruthenim powder to form ruthenium tetroxide;

absorbing said ruthenium tetroxide in a solution selected from the group consisting of a hydrochloric acid solution and a mixed solution of hydrochloric acid and ammonium chloride;

evaporating said solution which has absorbed said ruthenium tetroxide to dryness to form a resultant ruthenium salt;

sintering the resultant ruthenium salt in a hydrogen atmosphere to form high-purity ruthenium powder; and hot-pressing said high-purity ruthenium powder into a sputtering target.

2. A method for manufacturing a high-purity ruthenium sputtering target comprising the steps of:

feeding crude ruthenium powder into a sodium hydroxide solution;

blowing an ozone-containing gas and blowing chlorine gas into said sodium hydroxide solution which was fed with crude ruthenium powder to form ruthenium tetroxide;

absorbing said ruthenium tetroxide in a solution selected from the group consisting of a hydrochloric acid solution and a mixed solution of hydrochloric acid and ammonium chloride;

evaporating said solution which has absorbed said ruthenium tetroxide to dryness to form a resultant ruthenium salt;

sintering the resultant ruthenium salt in a hydrogen atmosphere to form high-purity ruthenium powder; and subjecting said high-purity ruthenium powder to electron beam melting to produce a sputtering target.

3. A method according to claim 1, wherein said ozone-containing gas is blown into said sodium hydroxide solution which was fed with crude ruthenium powder during said step of blowing chlorine gas into said sodium hydroxide solution which was fed with crude ruthenium powder.

4. A method according to claim 1, wherein said ozone-containing gas is blown into said sodium hydroxide solution which was fed with crude ruthenium powder after said step of blowing chlorine gas into said sodium hydroxide solution which was fed with crude ruthenium powder.

5. A method according to claim 2, wherein said ozone-containing gas is blown into said sodium hydroxide solution which was fed with crude ruthenium powder during said step of blowing chlorine gas into said sodium hydroxide solution which was fed with crude ruthenium powder.

6. A method according to claim 2, wherein said ozone-containing gas is blown into said sodium hydroxide solution which was fed with crude ruthenium powder after said step of blowing chlorine gas into said sodium hydroxide solution which was fed with crude ruthenium powder.

* * * * *